United States Patent [19]
Hsieh et al.

[11] Patent Number: 5,894,350
[45] Date of Patent: Apr. 13, 1999

[54] METHOD OF IN LINE INTRA-FIELD CORRECTION OF OVERLAY ALIGNMENT

[75] Inventors: Hung-Chang Hsieh, Hsin-Chu; Shinn-Sheng Yu, Chang-Hua, both of Taiwan

[73] Assignee: Taiwan Semiconductor Manufacturing Company, Ltd., Hsin-Chu, Taiwan

[21] Appl. No.: 09/097,143

[22] Filed: Jun. 12, 1998

[51] Int. Cl.$^6$ .................................................. G01B 11/00
[52] U.S. Cl. ............................. 356/399; 356/401; 250/548; 355/55
[58] Field of Search ............................. 356/399, 400, 356/401; 250/548; 355/55

[56] References Cited

U.S. PATENT DOCUMENTS

| | | | |
|---|---|---|---|
| 4,664,524 | 5/1987 | Hattori et al. | 356/401 |
| 4,768,883 | 9/1988 | Waldo et al. | 356/399 |
| 5,444,538 | 8/1995 | Pellegrini | 356/401 |
| 5,656,402 | 8/1997 | Kasuga | 430/22 |

*Primary Examiner*—Robert Kim
*Attorney, Agent, or Firm*—George O. Saile; Stephen B. Ackerman; Larry J. Prescott

[57] ABSTRACT

This invention describes a method of making intra-field corrections to the alignment of a step and repeat projection system used to expose image fields on an integrated circuit wafer. A first pattern having first image fields and first alignment marks is formed on a wafer. A mask having a second image field and second alignment marks is projected on the wafers, having a layer of photoresist formed thereon, using light which will not expose the photoresist. The relative location of the second alignment marks to the second image field is the same as the relative location of the first alignment marks to the first image field. A detectors, comprising an interferometer, determines the displacement vector between the first alignment marks and the corresponding second alignment marks. The displacement vectors are fed to a computer which computes a translation correction, a rotation correction, and a magnification correction for the alignment of the mask to the wafer. After the corrections are made the photoresist is exposed by projecting light which will expose the photoresist.

17 Claims, 2 Drawing Sheets

1

METHOD OF IN LINE INTRA-FIELD CORRECTION OF OVERLAY ALIGNMENT

BACKGROUND OF THE INVENTION

(1) Field of the Invention

This invention relates to an intra-field overlay alignment correction for a step and repeat exposure system, and more particularly to a method which provides an alignment correction prior to the exposure of each image field.

(2) Description of the Related Art

The use of Step and Repeat systems to expose patterns on integrated circuit wafers requires the use of both global or inter-field alignment and intra-field alignment. Most of the intra-field alignment schemes used make use of statistical data over a number of wafers to determine the correction parameters for a number of wafers, such as a production lot.

U.S. Pat. No. 5,444,538 to Pellegrini describes a method of determining correction parameters using least-squares analysis techniques of a number of wafers to determine the correction parameters for a number of wafers, such as a production lot.

U.S. Pat. No. 4,7685,883 to Waldo et al. describes a method of alignment using a reticle having an alignment mark positioned at the center of the reticle used to align each wafer in the stepper system as well as to adjust the stepper software.

U.S. Pat. No. 5,656,402 to Kasuga describes a method of determining alignment correction parameters using a method of reference to least squares in reference to the coordinates of each of the alignment marks and the coordinates of rational grid points.

SUMMARY OF THE INVENTION

As the dimensions of integrated circuits become smaller the alignment of photo images for serial processing steps becomes more and more critical. Many of these photo processing steps are carried out using step and repeat projection systems. In such systems the pattern formed on the integrated circuit wafer comprises a number of image fields, each field usually corresponding to a single chip or die. The masks used to expose the wafer usually comprise a single field. The projection system exposes one field on the wafer and the wafer is moved to the next location and the next field is exposed. It is of critical importance that the mask and wafer are properly aligned to each other for the exposure of each field.

The alignment between the mask and the wafer comprised two parts, global or inter-field alignment and alignment within a field or intra-field alignment. The global or inter-field alignment provides the alignment parameters required for moving the wafer to the next location for exposure of the next field. This alignment is determined from the design parameters of the pattern to be transferred to the wafer and is substantially the same for wafers of the same design and being patterned with the same pattern. The intra-field alignment provides correction to the alignment after the global or inter-field alignment has been accomplished The intra-field alignment adjusts the alignment for irregularities which can occur from one field to another on the same wafer such as slight deviations from planarity after chemical mechanical polishing steps, mask imperfections, pattern exposure errors from previous steps or the like. The global alignment parameters can be determined from wafer design information but proper intra-field alignment is critical to producing good integrated circuit wafers.

Frequently intra-field alignment parameters are determined by measuring alignment errors on a number of wafers. The data obtained from the error measurements are then analyzed and intra-field alignment parameters are determined for a number of wafers, such as a production lot. This is often unsatisfactory because the intra-field alignment errors are often random from one field to another and one wafer to another and one set of intra-field alignment parameters does not provide sufficient alignment accuracy.

It is a principle objective of this invention to provide a method of intra-field alignment wherein intra-field alignment is carried out before the exposure of each image field on a substrate.

It is another principle objective of this invention to provide a method of exposing a pattern on a layer of photoresist formed on a substrate wherein intra-field alignment is carried out before the exposure of each image field in the layer of photoresist.

These objectives are achieved by forming alignment marks in the scribe lines of each pattern layer formed on a wafer. When a wafer having a first pattern layer formed thereon is to be exposed for the formation of a second pattern layer the mask for the second pattern is projected onto each image field using light having a wavelength which will not expose the photoresist. The displacement vectors between each of the alignment marks of the first pattern and the corresponding alignment mark for the second pattern are measured using an optical interferometer. These displacement vectors are then fed to a computer and analyzed to produce a translation corrections a rotation corrections and a magnification correction for the alignment of each field. That field is then exposed using light having a wavelength which will expose the photoresist after the corrections have been made. The system then shifts to the next field and the process in repeated. In this manner intra-field alignment corrections are accomplished prior to the exposure of each field.

DESCRIPTION OF THE PREFERRED EMBODIMENTS

Figure 1:
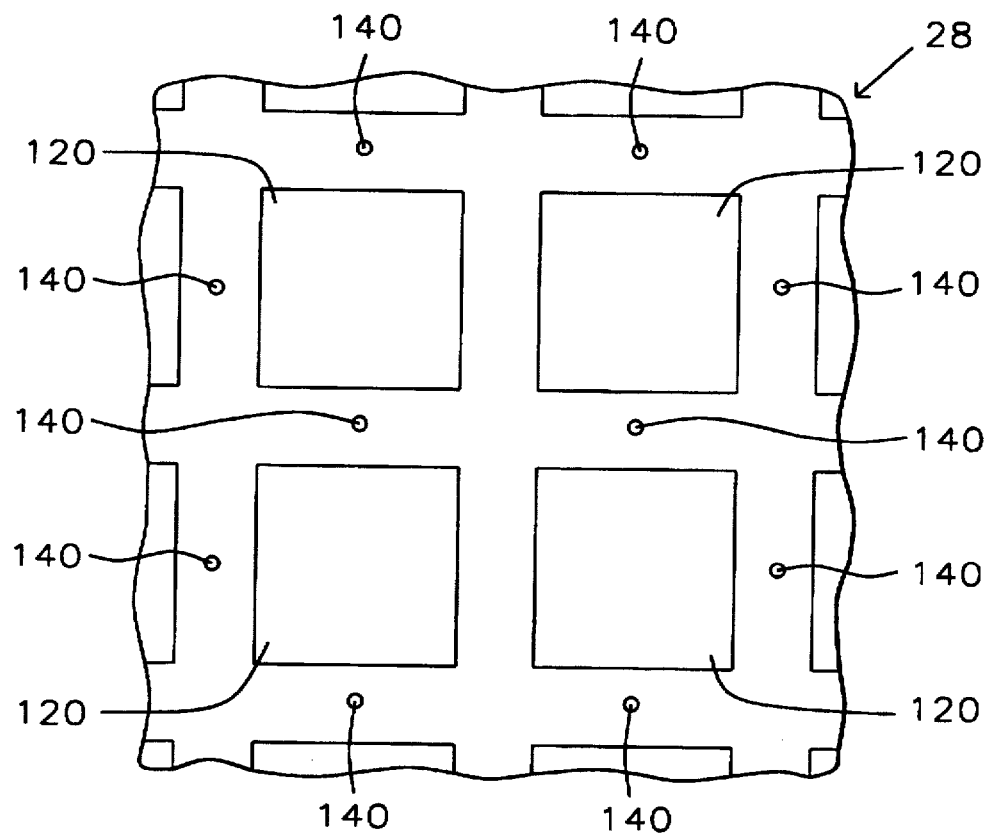
FIG. 1 shows a top view of a part of a substrate showing a number of image fields and a number of alignment marks.
Figure 2:
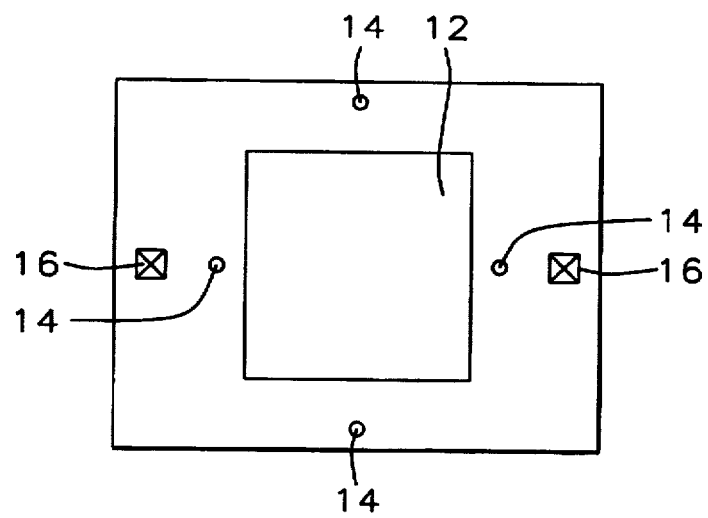
FIG. 2 shows a top view of a mask used to expose a single field on a substrate.
Figure 3:
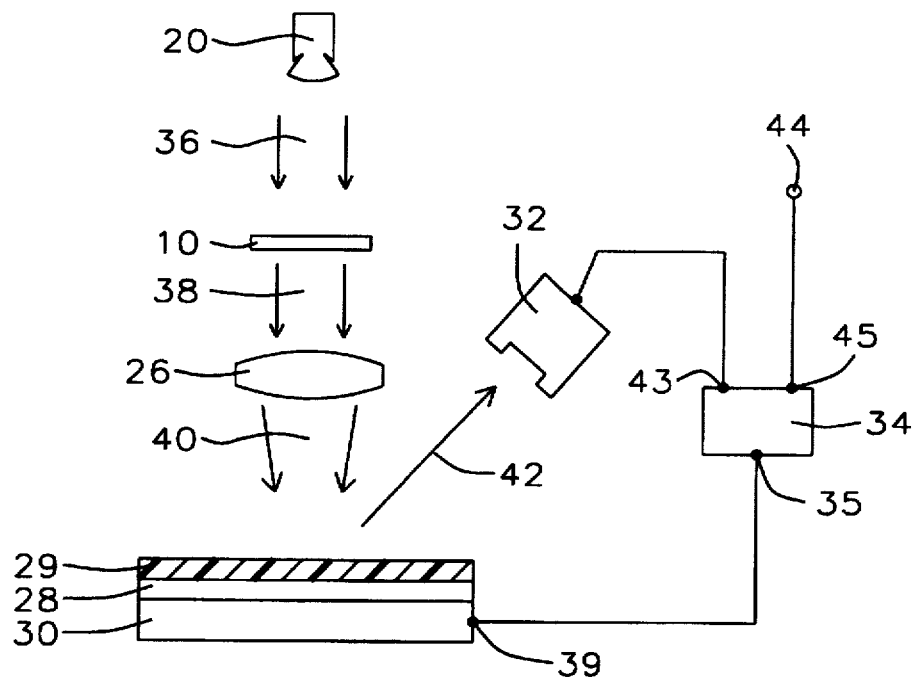
FIG. 3 shows a schematic view of an alignment and projection system used to expose the photoresist formed on a substrate.

Refer now to FIGS. 1–5 for a description of the preferred embodiments of the method of intra-field alignment of this invention. FIG. 1 shows a top view of a substrate 28, such as an integrated circuit wafer, which has a first level pattern formed thereon. The first level pattern has a number of first image fields 120 and a number of first intra-field alignment marks 140 which have been formed during previous process steps in the scribe lines around the first image fields 120. FIG. 2 shows a top view of a mask 10 having a second image field 12 and a number of second intra-field alignment marks 14 formed around the second image field 120 The second alignment marks 14 have the same position relative to the second image field 12 as the first alignment marks 140 have relative to the first image field 120. The mask also has global alignment marks 16 which will be used for global alignment of the mask to the substrate The pattern in the second image field 12 is to be formed on the substrate overlaying each of the patterns already formed in each of the first image fields on the substrate The formation of the pattern in the second image field on the substrate is accomplished using a step and repeat type projection system as shown schematically in FIG. 3. As shown in FIG. 3, light 36 from a light source 20 passes through the mask 10. The light 38 exiting the mask 10 passes through a reduction lens 26. The light 40 passing through the reduction lens 26 is focussed on the substrate 28 having a layer of photoresist 29 formed thereon. The substrate 28 is held on an alignment stage 30 which positions the substrate so that the image of the mask 10 which is focussed on the substrate 28 and the substrate 28 are in proper alignment, based on the control input 39 to the alignment stage. After one of the first image fields 120 of the substrate have been exposed the alignment stage 30 moves the substrate so that the next image field can be exposed.

The position of the alignment stage 30 is controlled by the output 35 of a computer 34 which is part of the projection system The output 35 of the computer 34 is fed to the control input 39 of the alignment stage. The computer output 35 is the result of the software residing in the computer 34, the global input 45 to the computer, and the intra-field input 43 to the computer. The computer output 35 supplies the controlling inputs for the alignment stage 30 so that alignment of the mask 10 to the substrate 28 is controlled by the software of the computer and the global and intra-field inputs to the computer. A detector 32 detects reflected light 42 from the substrate 28 and measures the displacement vector between the first alignment marks and the second alignment marks. The output of the detector 32 is connected to the intra-field input of the computer 34.

When a second pattern is to be exposed on a substrate 28 having a first pattern formed in a number of first image fields 120 and first alignment marks 140, see FIG. 1, the substrate 28, having a layer of photoresist 29 formed thereon, is placed on the alignment stage 30 and held in place. The mask 10 having the second pattern formed in a second image field 12 with second alignment marks 14, see FIG. 2, is placed in the projection system Global input parameters 44 are supplied to the computer global input 45 and the alignment stage 30 globally aligns the substrate 28 and the layer of photoresist 29 to the mask 10.

Figure 4:
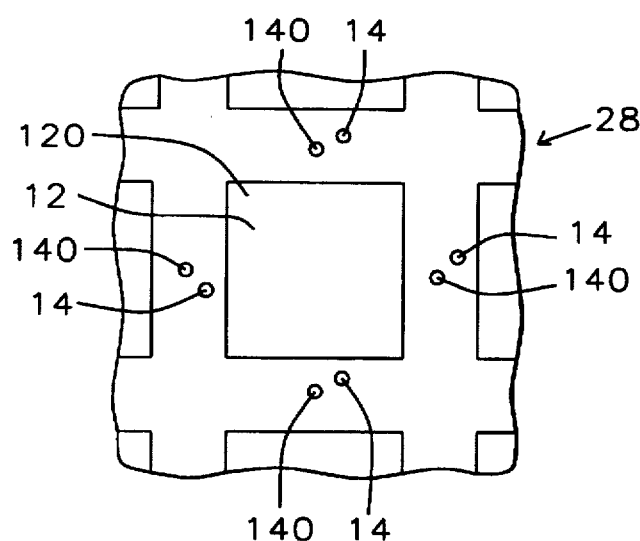
FIG. 4 shows a top view of a part of a substrate showing first alignment marks formed on the substrate and second alignment marks projected on the substrate.
Figure 5:
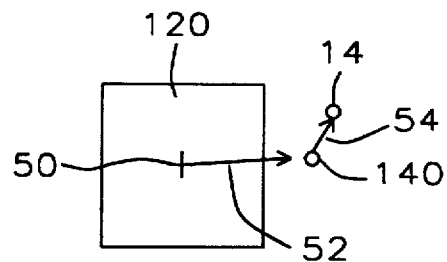
FIG. 5 shows a vector diagram of the location of one of the first alignment marks and the displacement vector to the corresponding second alignment mark.

The light source 20 then supplies light 36 having a wavelength which will not expose the photoresist 29 and an image of the second image field 12 and second alignment marks 14 is formed on the substrate, as shown in FIG. 4. FIG. 5 shows one of the first image fields 120, one of the first alignment marks 140, and the corresponding second alignment mark 14. The position vector 52, $R_i$, is a two dimensional vector indicating the position of this first alignment mark relative to the center of the first image field 120. In this description boldface quantities indicate vectors, in this example two dimensional vectors. The vector distance from this first alignment mark 140 to this second alignment mark 14 is the displacement vector 54, $V_i$, related to these alignment marks. Referring again to FIG. 3, the detector 32, detecting light 42 reflected from the substrate measures the displacement vectors, $V_i$, and feeds them to the intra-field input of the computer. The computer, using the input of the displacement vectors, $V_i$, and the associated position vectors, $R_i$, produces a translation correction, a rotation correction, and a magnification correction at the output 35 of the computer 34 which is fed to the control input 39 of the alignment stage 30. In this example the detector comprises an optical interferometer.

The computer then processes the displacement vectors, $V_i$, and the computer output supplies a translation correction, a rotation correction, and a magnification correction to the alignment stage 30. The light source 20 then supplies light 36 having a wavelength which will expose the photoresist 29 and the photoresist is exposed with the pattern in the second image field. New global inputs 44 are then supplied to the computer global input 45, the next first field on the substrate is aligned to the mask, and the process is repeated. This process provides intra-field alignment for each image field before the photoresist is exposed.

Refer now to FIG. 5, for a description of the algorithm used by the computer to compute the translation correction, rotation correction, and magnification correction. The translation correction for the case of N first alignment marks and N second alignment marks is a two dimensional vector, $T_B$, and is given by the equation $T_B = -(1/N)(\Sigma_{(i)} V_i)$, where the summation is over the N displacement vectors 54. The rotation correction, $R_B$, is a scaler quantity and is given by the equation $R_B = -(1/N)\ \Sigma_{(i)}(V_i \cdot t_i)/(|R_i|)$, where $t_i$ is a unit vector rotated 90° counter clockwise from the direction of the position vector 52, $R_i$, $V_i \cdot t_i$ is the scaler product of $V_i$ and $t_i$, and $|R_i|$ is the magnitude of the position vector 52, $R_i$. The magnification correction, $M_B$, is a scaler quantity and is given by the equation $M_B = -(1/N)\ \Sigma_{(i)}(V_i \cdot n_i)/(|R_i|)$, where $n_i$ is a unit vector in the direction of the position vector 52, $R_i$, $V_i \cdot n_i$ is the scaler product of $V_i$ and $n_i$, and $|R_i|$ is the magnitude of the position vector 52, $R_i$. These equations involve some simplifying assumptions but for a first image field of about 10 millimeters or less by about 10 millimeters or less the error introduced by the assumptions is less than one nanometer.

While the invention has been particularly shown and described with reference to the preferred embodiments thereof, it will be understood by those skilled in the art that various changes in form and details may be made without departing from the spirit and scope of the invention.

What is claimed is:

1. A method of aligning a substrate and a mask, comprising the steps of:

providing a substrate having a first number of first image fields and a second number of first alignment marks, wherein there are a third number of said first alignment marks around the periphery of each of said first image fields;

providing a projection system for optically projecting a mask pattern on said substrate;

providing a computer having a global input, an intra-field input, and an output;

providing an alignment stage having an alignment input connected to said computer outputs whereby said mask pattern is aligned to said substrate;

providing a detector wherein said detector measures the displacement vector between two alignment marks;

providing a mask having a second image field and a third number of second alignment marks around the periphery of said second image field, wherein the location of said second alignment marks relative to said second image field is the same as the location of said first alignment marks relative to said first image field;

providing global alignment parameters;

feeding said global alignment parameters to said global input of said computer thereby producing a global alignment of said mask pattern to said substrate;

projecting said second image field and said second alignment marks on said substrate;

measuring the displacement vectors between each of said first alignment marks and the corresponding said second alignment mark using said detector; and feeding the values of each of said displacement vectors to said intra-field input of said computer thereby producing a translation correction, a rotation correction, and a magnification correction to said alignment of said mask to said substrate.

2. The method of claim 1 wherein said substrate is an integrated circuit wafer.

3. The method of claim 1 wherein said detector comprises an optical interferometer.

4. The method of claim 1 wherein said translation correction is equal to minus one multiplied by the sum of said displacement vectors divided by said third number.

5. The method of claim 1 wherein said rotation correction is equal to the quantity of minus one divided by said third number multiplied by the sum of the component of each of said third number of said displacement vectors perpendicular to the position vector from the center of said selected first image field to the corresponding said first alignment mark divided by the magnitude of said position vector.

6. The method of claim 1 wherein said magnification correction is equal to the quantity of minus one divided by said third number multiplied by the sum of the component of each of said third number of said displacement vectors in the direction of the position vector from the center of said selected first image field to the corresponding said first alignment mark divided by the magnitude of said position vector.

7. The method of claim 1 wherein said first alignment marks are formed in the scribe lines of said substrate between said first image fields.

8. The method of claim 1 wherein said second alignment marks are projected on the scribe lines of said substrate between said first image fields.

9. A method of exposing a layer of resist on a substrate, comprising the steps of:

providing a substrate having a first number of first image fields and a second number of first alignment marks, wherein there are a third number of said first alignment marks around the periphery of each of said first image fields;

providing a projection system for optically projecting a mask pattern on said substrate;

providing a computer having a global input, an intra-field input, and an output;

providing an alignment stage having an alignment input whereby said mask pattern is aligned to said substrate;

providing a detector wherein said detector measures the displacement vector between two alignment marks;

providing a mask having a second image field and a third number of second alignment marks around the periphery of said second image field, wherein the location of said second alignment marks relative to said second image field is the same as the location of said first alignment marks relative to said first image field;

providing global alignment parameters;

forming a layer of resist on said substrate;

feeding said global alignment parameters to said global inputs of said computer thereby producing a global alignment of said mask pattern to said substrate;

projecting said second image field and said second alignment marks on said substrate using light having a wavelength which will not expose said layer of resist;

measuring the displacement vectors between each of said first alignment marks and the corresponding said second alignment mark using said detector;

feeding the values of each of said displacement vectors to said intra-field input of said computer thereby producing a translation correction, a rotation corrections, and a magnification correction to said alignment of said mask to said substrate; and projecting said second image field on said layer of resist formed on said substrate using light having a wavelength which will expose said layer of resist thereby exposing said layer of resist.

10. The method of claim 9 wherein said substrate is an integrated circuit wafer.

11. The method of claim 9 wherein said detector comprises an optical interferometer.

12. The method of claim 9 wherein said translation correction is equal to minus one multiplied by the sum of said displacement vectors divided by said third number.

13. The method of claim 9 wherein said rotation correction is equal to the quantity of minus one divided by said third number multiplied by the sum of the component of each of said third number of said displacement vectors perpendicular to the position vector from the center of said selected first image field to the corresponding said first alignment mark divided by the magnitude of said position vector.

14. The method of claim 9 wherein said magnification correction is equal to the quantity of minus one divided by said third number multiplied by the sum of the component of each of said third number of said displacement vectors in the direction of the position vector from the center of said selected first image field to the corresponding said first alignment mark divided by the magnitude of said position vector.

15. The method of claim 9 wherein said layer of resist is a layer of photoresist.

16. The method of claim 9 wherein said first alignment marks are formed in the scribe lines of said substrate between said first image fields.

17. The method of claim 9 wherein said second alignment marks are projected on the scribe lines of said substrate between said first image fields.

* * * * *